United States Patent
Kim et al.

(10) Patent No.: US 9,147,489 B2
(45) Date of Patent: Sep. 29, 2015

(54) HIGH VOLTAGE SWITCH AND A NONVOLATILE MEMORY DEVICE INCLUDING THE SAME

(71) Applicant: SAMSUNG ELECTRONICS CO., LTD., Suwon-si, Gyeonggi-Do (KR)

(72) Inventors: Taehyun Kim, Seongnam-si (KR); Youngsun Min, Hwaseong-si (KR); Bilal Ahmad Janjua, Suwon-si (KR); Jeongdon Ihm, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 39 days.

(21) Appl. No.: 14/077,769

(22) Filed: Nov. 12, 2013

(65) Prior Publication Data

US 2014/0204676 A1    Jul. 24, 2014

(30) Foreign Application Priority Data

Jan. 22, 2013 (KR) .................. 10-2013-0007087

(51) Int. Cl.
| | |
|---|---|
| G11C 16/06 | (2006.01) |
| G11C 16/30 | (2006.01) |
| G11C 16/04 | (2006.01) |
| G11C 16/12 | (2006.01) |

(52) U.S. Cl.
CPC ............ *G11C 16/30* (2013.01); *G11C 16/0483* (2013.01); *G11C 16/12* (2013.01)

(58) Field of Classification Search
CPC ...... G11C 16/12; G11C 8/08; G11C 13/0028; G11C 5/145; G11C 16/30; G11C 29/83; G11C 16/3445; G11C 5/147; G11C 8/14
USPC ......... 365/185.23, 189.11, 230.06, 226, 227, 365/229, 230.08
See application file for complete search history.

(56) References Cited

U.S. PATENT DOCUMENTS

| | | | |
|---|---|---|---|
| 7,157,957 B2 | 1/2007 | Kim | |
| 7,492,206 B2 | 2/2009 | Park et al. | |
| 7,515,503 B2 | 4/2009 | Lee et al. | |
| 7,542,349 B2 | 6/2009 | Rai et al. | |
| 7,609,554 B2 | 10/2009 | Tanzawa | |
| 8,390,342 B2 | 3/2013 | Jang | |
| 8,446,784 B2 | 5/2013 | Tanzawa | |
| 2011/0156796 A1* | 6/2011 | Jang .............................. | 327/436 |
| 2011/0273940 A1 | 11/2011 | Tanzawa | |

FOREIGN PATENT DOCUMENTS

| | | |
|---|---|---|
| JP | 06-231591 | 8/1994 |
| KR | 1020050108132 | 11/2005 |
| KR | 1020050108134 | 11/2005 |

* cited by examiner

*Primary Examiner* — Thong Q Le
(74) *Attorney, Agent, or Firm* — F. Chau & Associates, LLC

(57) ABSTRACT

A high voltage switch of a nonvolatile memory device includes a depletion type NMOS transistor configured to switch a second driving voltage in response to an output signal of the high voltage switch; at least one inverter configured to convert a voltage of an input signal of the high voltage switch into a first driving voltage or a ground voltage, wherein the first and second driving voltages are received from an external device; and a PMOS transistor configured to transfer the second driving voltage provided to a first terminal of the PMOS transistor from the depletion type NMOS transistor to a second terminal of the PMOS transistor as the output signal in response to an output of the at least one inverter, wherein the output of the at least one inverter is transferred to a gate terminal of the PMOS transistor.

16 Claims, 10 Drawing Sheets

HIGH VOLTAGE SWITCH AND A NONVOLATILE MEMORY DEVICE INCLUDING THE SAME

CROSS-REFERENCE TO RELATED APPLICATION

This U.S. non-provisional patent application claims priority under 35 U.S.C. §119 to Korean Patent Application No. 10-2013-0007087 filed Jan. 22, 2013, in the Korean Intellectual Property Office, the disclosure of which is incorporated by reference herein in its entirety.

BACKGROUND

1. Technical Field

The inventive concept relates to a semiconductor device, and more particularly, to a high voltage switch and a nonvolatile memory device including the same.

2. Discussion of the Related Art

Semiconductor memory devices may be volatile or nonvolatile. The volatile semiconductor memory devices may perform read and write operations at a high speed, but lose data when their power supply is off or interrupted. The nonvolatile semiconductor memory devices do not require a maintained power supply and can retain data even when not powered. Thus, the nonvolatile semiconductor memory devices are used to store data which must be retained when power is gone.

A flash memory device is a type of nonvolatile semiconductor memory device. The flash memory device may be used as a voice and image data storing medium of information appliances such as a computer, a cellular phone, a personal digital assistant (PDA), a digital camera, a camcorder, a voice recorder, an MP3 player, a handheld personal computer (PC), a game machine, a facsimile, a scanner, a printer, and the like.

A high voltage Vpp higher than a power supply voltage VDD may be provided to the flash memory device from an external device. A high voltage of about 20V may be used to program and erase memory cells of the flash memory device. A high voltage switch for controlling the high voltage Vpp may also be provided. However, the high voltage Vpp supplied from the external device may be decreased below a reference value due to external factors. In this case, a leakage current path may be generated between the power supply voltage VDD and the high voltage Vpp.

SUMMARY

An exemplary embodiment of the inventive concept provides a high voltage switch of a nonvolatile memory device, comprising a first depletion type NMOS transistor configured to switch a second driving voltage in response to an output signal of the high voltage switch; at least one inverter configured to convert a voltage of an input signal of the high voltage switch into a first driving voltage or a ground voltage, wherein the first and second driving voltages are received from an external device; and a PMOS transistor configured to transfer the second driving voltage provided to a first terminal of the PMOS transistor from the first depletion type NMOS transistor to a second terminal of the PMOS transistor as the output signal in response to an output of the at least one inverter, wherein the output of the at least one inverter is transferred to a gate terminal of the PMOS transistor.

The at least one inverter comprises: a first inverter configured to invert the input signal; and a second inverter configured to invert an output of the first inverter.

An output of the second inverter is provided to the gate terminal of the PMOS transistor.

The high voltage switch further comprises a second depletion type NMOS transistor configured to transfer the second driving voltage to the first terminal of the PMOS transistor in response to the output of the first inverter.

The high voltage switch further comprises an NMOS transistor configured to connect the second terminal of the PMOS transistor and a ground in response to the output of the at least one inverter.

The high voltage switch further comprises a second depletion type NMOS transistor configured to connect the second terminal of the PMOS transistor and a first terminal of the NMOS transistor.

A gate terminal of the second depletion type NMOS transistor is grounded.

The first driving voltage is a pull-up voltage of the at least one inverter.

An exemplary embodiment of the inventive concept provides a nonvolatile memory device, comprising a cell array including memory cells connected to a word line and a bit line; a pass transistor configured to transfer a first high voltage to the word line; and a high voltage switch configured to convert a voltage level of an input signal of the high voltage switch to a second high voltage provided from an external device to be applied to a gate of the pass transistor. The high voltage switch comprises at least one inverter configured to pull a voltage level of the input signal up to the second high voltage or down to a ground voltage; a PMOS transistor having a gate connected to receive an output of the at least one inverter and configured to transfer the second high voltage provided to a source of the PMOS transistor to a drain of the PMOS transistor; and a first depletion type NMOS transistor configured to transfer the second high voltage to the source of the PMOS transistor in response to an output signal of the high voltage switch transferred to the drain of the PMOS transistor.

The first high voltage is obtained by boosting the second high voltage.

The input signal is a block selection signal.

The nonvolatile memory device further comprises a second depletion type NMOS transistor configured to transfer the second high voltage to the source of the PMOS transistor in response to the input signal.

The nonvolatile memory device further comprises an NMOS transistor configured to connect the drain of the PMOS transistor and a ground in response to the input signal.

The nonvolatile memory device further comprises a second depletion type NMOS transistor connected between the NMOS transistor and the PMOS transistor.

A gate of the second depletion type NMOS transistor is grounded.

An exemplary embodiment of the inventive concept provides an inverter unit configured to receive an input signal of the high voltage switch; a first depletion type transistor configured to receive an output of the high voltage switch and a high voltage provided from an external device; and a transistor configured to receive a first output of the inverter unit at a first terminal and the high voltage via the first depletion type transistor at a second terminal, wherein a third terminal of the transistor provides the output of the high voltage switch.

The inverter unit includes a plurality of inverters.

The first depletion type transistor is a depletion type NMOS transistor.

The transistor is a PMOS transistor.

The high voltage switch further comprises a second depletion type transistor configured to transfer the high voltage to the transistor in response to a second output of the inverter unit.

BRIEF DESCRIPTION OF THE DRAWINGS

The above and other features of the inventive concept will become more apparent by describing in detail exemplary embodiments thereof with reference to the attached drawings, in which.

DETAILED DESCRIPTION OF THE EMBODIMENTS

Figure 1:
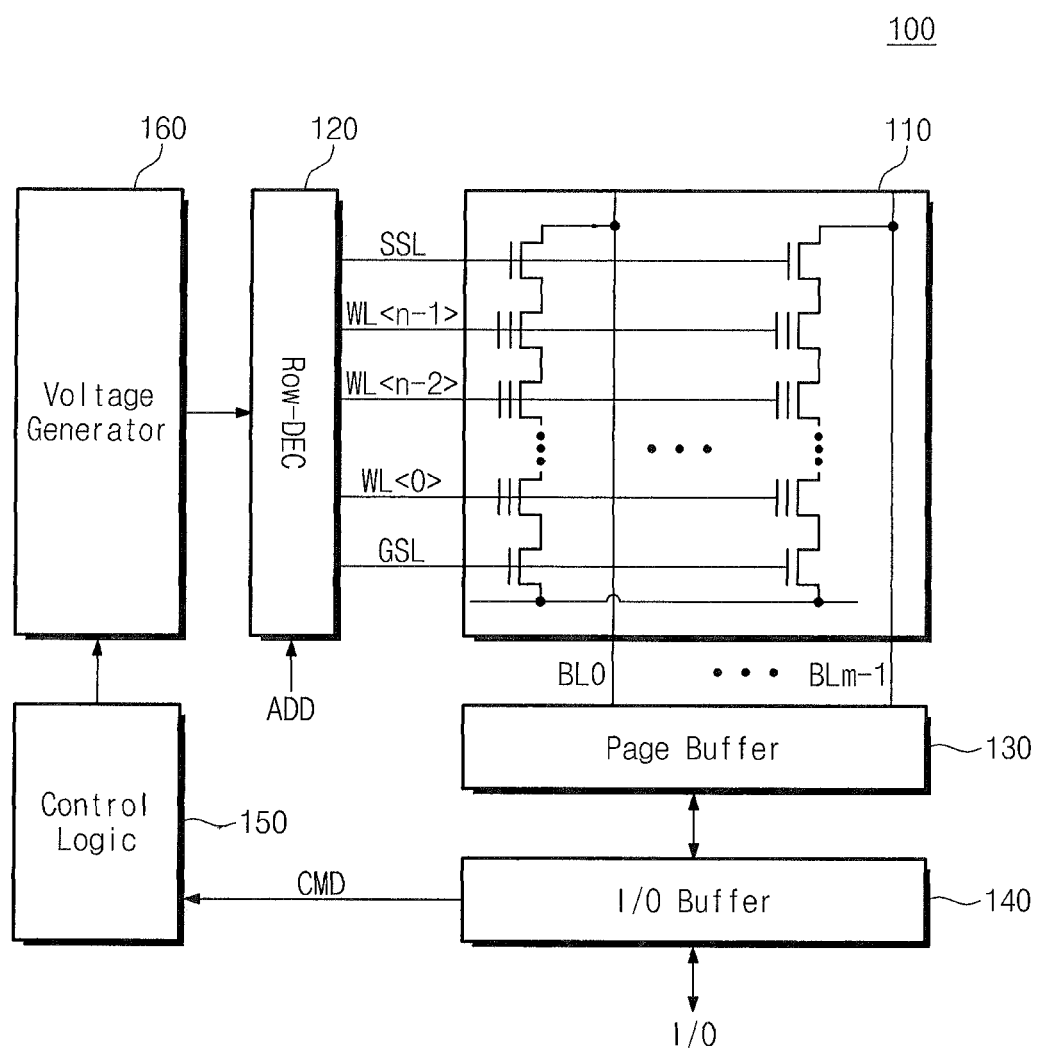
FIG. 1 is a block diagram illustrating a nonvolatile memory device according to an exemplary embodiment of the inventive concept.

Hereinafter, exemplary embodiments of the inventive concept will be described in detail with reference to the accompanying drawings. The inventive concept, however, may be embodied in various different forms, and should not be construed as being limited to the illustrated embodiments. Like reference numerals may denote like elements throughout the attached drawings and written description.

As used herein, the singular forms "a," "an" and "the" are intended to include the plural forms as well, unless the context clearly indicates otherwise.

It will be understood that when an element is referred to as being "on," "connected to," "coupled to," or "adjacent to" another element, it can be directly on, connected, coupled, or adjacent to the other element, or intervening elements may be present.

Below, exemplary embodiments of the inventive concept will be described using a flash memory device as a nonvolatile storage medium. However, the inventive concept is not limited thereto. For example, the storage medium may be formed of a phase-change random access memory (PRAM), a magnetoresistive RAM (MRAM), a resistive RAM (ReRAM), a ferroelectric RAM (FRAM), a NOR flash memory, or the like. In addition, exemplary embodiments of the inventive concept may be applied to semiconductor devices supplied with a high voltage from an external device.

FIG. 1 is a block diagram illustrating a nonvolatile memory device 100 according to an exemplary embodiment of the inventive concept. Referring to FIG. 1, a nonvolatile memory device 100 may include a memory cell array 110, a row decoder 120, a page buffer circuit 130, an input/output buffer 140, control logic 150, and a voltage generator 160.

The memory cell array 110 may be coupled with the row decoder 120 via word lines WL<0> to WL<n-1> and selection lines SSL and GSL. Selection line SSL may be a string selection line and selection line GSL may be a ground selection line. The memory cell array 110 may be coupled with the page buffer circuit 130 via bit lines BL0 to BLm-1. The memory cell array 110 may include a plurality of NAND cell strings. Each cell string may form a channel in a vertical or horizontal direction. Memory cells included in each NAND cell string may be programmed or erased by a high voltage provided from the row decoder 120.

The row decoder 120 may select one of a plurality of memory blocks of the cell array 110 in response to a row address ADD. The row decoder 120 may select one of the word lines of the selected memory block. The row decoder 120 may provide a word line or selection lines SSL and GSL of the selected memory block with a high voltage provided from the voltage generator 160. The row decoder 120 may include a pass transistor formed of a high voltage transistor to transfer a high voltage to the selected memory block. The pass transistor may be turned on or off by the high voltage. Thus, a high voltage switch for boosting a low voltage of a control signal to a high voltage may be used to switch the pass transistor.

The high voltage switch may be formed of a level shifter which converts a low voltage of a control signal into a high voltage Vpp provided from an external device. The high voltage switch makes it possible to control a pass transistor formed of a high voltage transistor using a low voltage. The high voltage switch according to an exemplary embodiment of the inventive concept may maintain a stable power supply voltage level against a variation in the high voltage Vpp provided from the external device. This is because a leakage current path between a node supplied with a first driving voltage VDD used as a power of low voltage circuits and a node supplied with a second driving voltage Vpp as a high voltage provided from the external device is blocked.

The page buffer circuit 130 may operate as a write driver or a sense amplifier according to a mode of operation. At a program operation, the page buffer circuit 130 may provide a bit line of the memory cell array 110 with a bit line voltage corresponding to data to be programmed. At a read operation, the page buffer circuit 130 may sense data stored in a selected memory cell through a bit line and output the sensed data to the input/output buffer 140.

The input/output buffer 140 may transfer input data (e.g., I/O) to the page buffer circuit 130 or read data (e.g., I/O) provided from the page buffer circuit 130 to the external device. The input/output buffer 140 may transfer input addresses or commands to the control logic 150 or the row decoder 120.

The control logic 150 may control program, read and erase operations in response to a command CMD transferred from the external device through the input/output buffer 140. At a read operation, the control logic 150 may control the voltage generator 160 to generate a selection read voltage Vrd, a non-selection read voltage Vread, and selection line voltages $V_{SSL}$ and $V_{GSL}$. The control logic 150 may control the page buffer 130 to sense data through the bit line BL.

The voltage generator 160 may generate word line voltages to be supplied to word lines and a voltage to be supplied to a bulk (e.g., a well region) where memory cells are formed. The word line voltages to be supplied to word lines may include a program voltage, a pass voltage, selection and non-selection read voltages, and so on. The voltage generator 160 may generate the selection line voltages $V_{SSL}$ and $V_{GSL}$ to be provided to the selection lines SSL and GSL at a read and a program operation. The voltage generator 160 may provide an erase voltage Vers of a high voltage to a bulk of a selected memory block at an erase operation.

The voltage generator 160 may use the high voltage Vpp provided from the external device to generate a high voltage used for erasing or programming. Boosting speed and efficiency may be improved by using the high voltage Vpp provided from the external device.

With the row decoder 120 of the nonvolatile memory device 100, a leakage current path of the high voltage switch may not be formed even with a variation in the high voltage Vpp provided from the external device. Thus, it is possible to reduce power consumption of the nonvolatile memory device 100 due to a leakage current.

Figure 2:
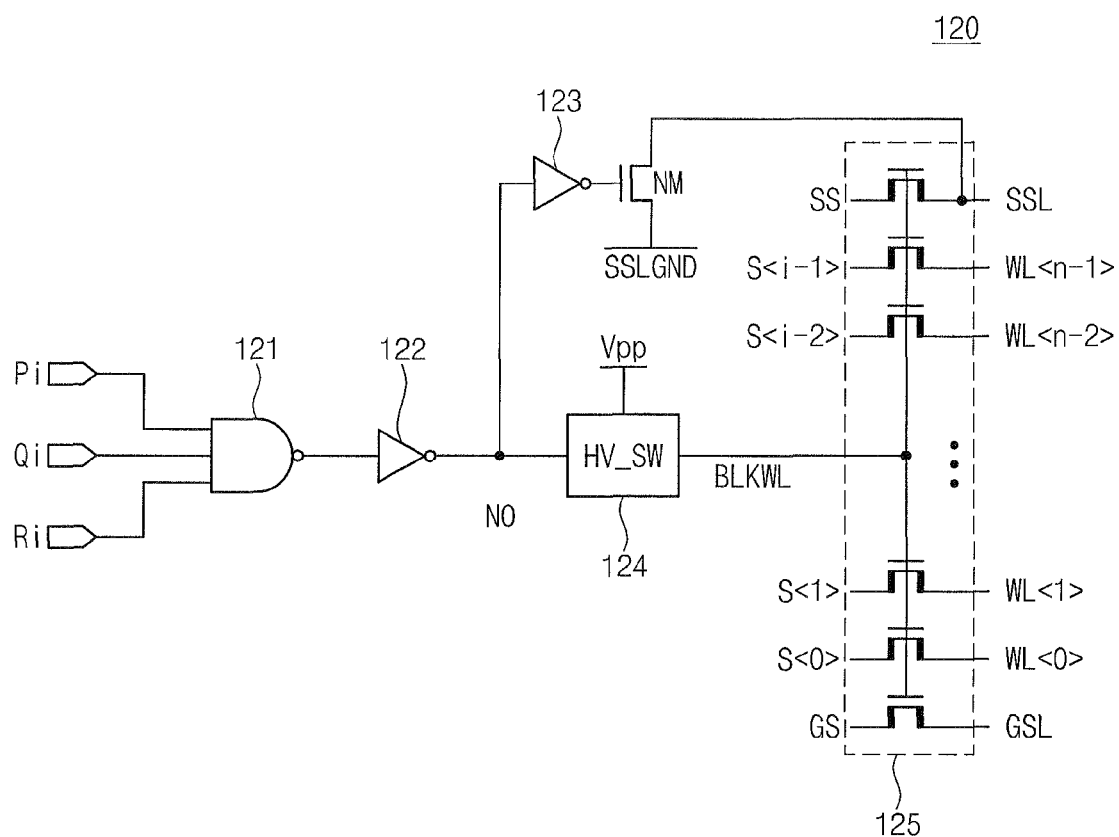
FIG. 2 is a circuit diagram illustrating a row decoder according to an exemplary embodiment of the inventive concept.

FIG. 2 is a circuit diagram illustrating a row decoder according to an exemplary embodiment of the inventive concept. Referring to FIG. 2, a row decoder 120 may include a NAND gate 121, inverters 122 and 123, a high voltage switch 124, and a pass transistor 125.

The NAND gate 121 and the inverter 122 may constitute a block decoder. The NAND gate 121 may logically combine decoding signals Pi, Qi and Ri provided by a row address. The inverter 122 may invert an output of the NAND gate 121. The row decoder 120 may further comprise a circuit for blocking an output of the NAND gate 121 according to whether a selected block is a bad block. An output of the inverter 122 may be transferred to a node N0 as a block selection signal having a low voltage.

If the decoding signals Pi, Qi and Ri are activated, the node N0 may be set to a 'HIGH' level. At this time, a switch NM for disabling a string selection line SSL may be turned off. Switch NM is connected to ground, e.g., SSLGND. The high voltage switch 124 may output the block selection signal having a high voltage in response to a logic value of the node N0. The block selection signal having the high voltage may be transferred to a block word line BLKWL. The pass transistor 125 may be switched on by the block selection signal with the high voltage provided on the block word line BLKWL.

The pass transistor 125 may transfer voltages SS, GS and S<0> to S<i-1> generated from a voltage generator 160 (refer to FIG. 1) to selection lines SSL and GSL and word lines WL<0> to WL<n-1>. A word line voltage transferred through the pass transistor 125 may be higher than a voltage used to drive general circuits. Thus, the pass transistor 125 may be formed of a high voltage transistor driven by a high voltage. A channel of the high voltage transistor may be formed to be longer than that of a low voltage transistor to tolerate a high voltage (e.g., to prevent punch through between a drain and a source). In addition, a gate oxide film of the high voltage transistor may be formed to be thicker than that of a low voltage transistor to tolerate the high voltage (e.g., to tolerate a high potential difference between a gate and a drain/source). In other words, an area needed to form the high voltage transistor may be wider than that needed to form the low voltage transistor.

The high voltage switch 124 according to an exemplary embodiment of the inventive concept may receive a high voltage Vpp provided from an external device to convert a low voltage of a block selection signal into a high voltage. However, the high voltage switch 124 according to an exemplary embodiment of the inventive concept may not have a leakage current path between a terminal supplied with a first driving voltage VDD provided as a power of a low voltage circuit and a terminal supplied with a second driving voltage Vpp provided as a high voltage from an external device. Thus, although the second driving voltage Vpp is lower than the first driving voltage VDD, a leakage current may not be generated.

Figure 3:
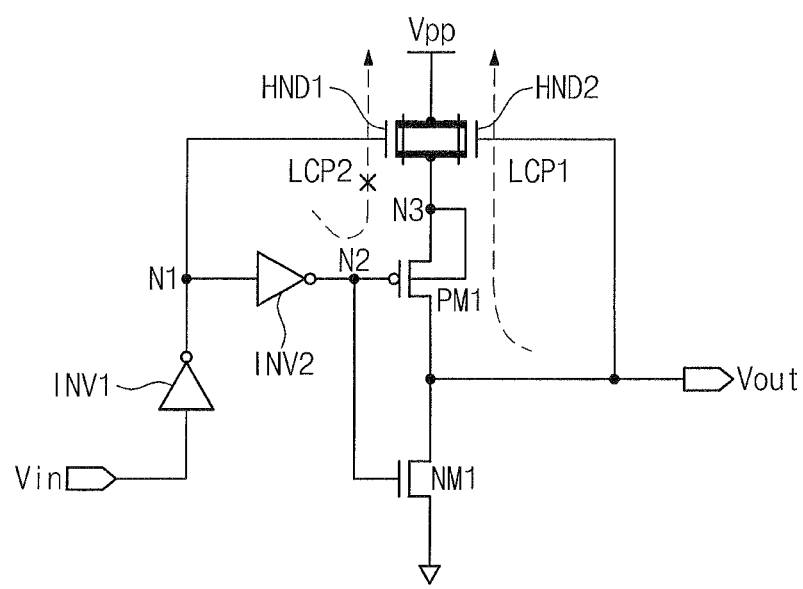
FIG. 3 is a circuit diagram illustrating a high voltage switch according to an exemplary embodiment of the inventive concept.

FIG. 3 is a circuit diagram illustrating a high voltage switch according to an exemplary embodiment of the inventive concept. Referring to FIG. 3, a high voltage switch 124 may include first and second inverters INV1 and INV2, first and second depletion type transistors HND1 and HND2, a PMOS transistor PM1, and an NMOS transistor NM1. The depletion type transistors may be depletion type NMOS transistors, for example.

An input signal Vin may be provided to the first inverter INV1. An output signal of the first inverter INV1 may be provided to the second inverter INV2. An output terminal of the first inverter INV1 may correspond to a first node N1. The output signal of the first inverter INV1 may be applied to a gate of the first depletion type transistor HND1. Here, a first driving voltage VDD provided from an external device may be used as a power supply voltage of the first and second inverters INV1 and INV2. Thus, output signals of the first and second inverters INV1 and INV2 may have a ground voltage (e.g., 0V) or the first driving voltage VDD. As a result, the input signal Vin transferred to the first node N1 and a second node N2 may have a ground voltage (e.g., 0V) or the first driving voltage VDD.

An output terminal of the second inverter INV2 may correspond to the second node N2. The second node N2 may be connected to gates of the PMOS and NMOS transistors PM1 and NM1. A connection node of a drain of the PMOS transistor PM1 and a source of the NMOS transistor NM1 may form an output terminal of the high voltage switch 124. The PMOS and NMOS transistors PM1 and NM1 may operate as an inverter.

The first and second depletion type transistors HND1 and HND2 may constitute a unit for providing a source of the PMOS transistor PM1 with a second driving voltage Vpp which is a high voltage provided from an external device in time.

When a voltage of the source of the PMOS transistor PM1 is a low voltage, the first depletion type transistor HND1 may be used to quickly switch the second driving voltage Vpp. For example, an output voltage Vout of the high voltage switch 124 may be fed back to the gate of the second depletion type transistor HND2. Thus, the second driving voltage Vpp may not be quickly transferred to the source of the PMOS transistor PM1.

For example, it is assumed that the input signal Vin transitions from a high level to a low level. In this case, the same high level as that of the input signal Vin may be first provided to the second node N2, in other words, the gate of the PMOS transistor PM1. At this time, the output terminal Vout may be set to a voltage of (VDD−Vthp). Here, 'Vthp' may represent a threshold voltage of the PMOS transistor PM1. A voltage of the output terminal Vout may be provided to the gate of the second depletion type transistor HND2. In this case, a source of the PMOS transistor PM1, in other words, a node N3 may be set to a voltage of VDD−Vthp−(−Vthd) (=VDD−Vthp+Vthd). Here, '(−Vthd)' may represent a threshold voltage of the second depletion type transistor HND2. The threshold voltage of the first PMOS transistor PM1 and the threshold voltage of the second depletion type transistor HND2 may depend greatly on a process characteristic. Thus, when a voltage level of the source of the PMOS transistor PM1, in other words, the node N3 is insufficient, the PMOS transistor PM1 may not be fully turned on. However, the first depletion type transistor HND1 may prevent this from happening. For example, a voltage of the first node N1 may enable the first depletion type transistor HND1 to be first turned on without using a feedback procedure. This makes it possible to increase a voltage level of the node N3, in other words, the source of the PMOS transistor PM1 sufficient to fully turn on the PMOS transistor PM1. Thus, a switching speed of the high voltage switch 124 may be improved. In other words, quickened.

The high voltage switch 124 may not include a current path between the first driving voltage VDD of the inverters INV1 and INV2 and the second driving voltage Vpp of the depletion type transistors HND1 and HND2. In general, the second driving voltage Vpp provided as a high voltage may be received through a high voltage input terminal (a separate pad) of a semiconductor device. However, a level of the second driving voltage Vpp may be varied due to an external factor. In the event that a level of the second driving voltage Vpp is sharply lowered, a leakage current path LCP2 may be formed between a terminal supplied with the first driving voltage VDD and a terminal supplied with the second driving voltage Vpp due to a voltage difference. The leakage current may cause a sharp increase in power consumption and an increase in the probability of an abnormal operation. However, the high voltage switch 124 according to an exemplary embodiment of the inventive concept may be configured such that the first driving voltage VDD is connected to gates of the PMOS and NMOS transistors PM1 and NM1. Thus, drain-source channels of transistors placed between the first driving voltage VDD and the second driving voltage Vpp may not be formed.

Although a leakage current path LCP1 of the output terminal Vout is formed, the high voltage switch 124 according to an exemplary embodiment of the inventive concept may block the leakage current path LCP2 of the first driving voltage VDD. Thus, a nonvolatile memory device 100 adopting the high voltage switch 124 may reduce power consumption and perform a stable switching operation.

Figure 4:
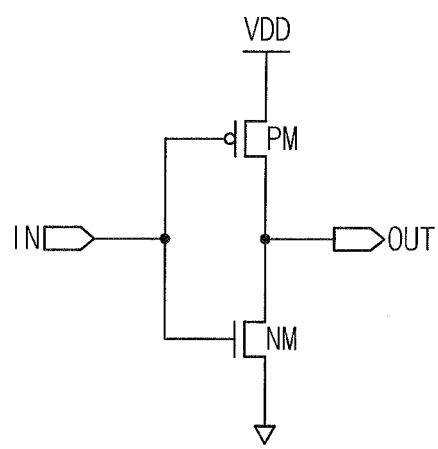
FIG. 4 is a circuit diagram illustrating a second inverter of FIG. 3, according to an exemplary embodiment of the inventive concept.

FIG. 4 is a circuit diagram illustrating a second inverter of FIG. 3, according to an exemplary embodiment of the inventive concept. Referring to FIG. 4, a second inverter INV2 may be formed of a pair of PMOS and NMOS transistors PM and NM.

An input signal of the second inverter INV2 may be provided to gates of the PMOS and NMOS transistors PM and NM. A first driving voltage VDD provided from an external device may be applied to a source of the PMOS transistor PM. A source of the NMOS transistor NM may be grounded. A connection of drains of the PMOS and NMOS transistors PM and NM may form an output terminal OUT of the second inverter INV2. A voltage level of the output terminal OUT may swing between the first driving voltage VDD and a ground voltage according to a level of the input signal at input terminal IN. The output terminal of the second inverter INV2 may be connected to gates of transistors PM1 and NM1 as illustrated in FIG. 3. Thus, a voltage of the output terminal OUT of the second inverter INV2 may not be affected by a variation in a level of a second driving voltage Vpp which is a high voltage provided from an external device.

In FIG. 4, there is illustrated an example of the second inverter INV2. However, a first inverter INV1 of FIG. 3 may be configured in substantially the same way as described with reference to FIG. 4.

Figure 5:
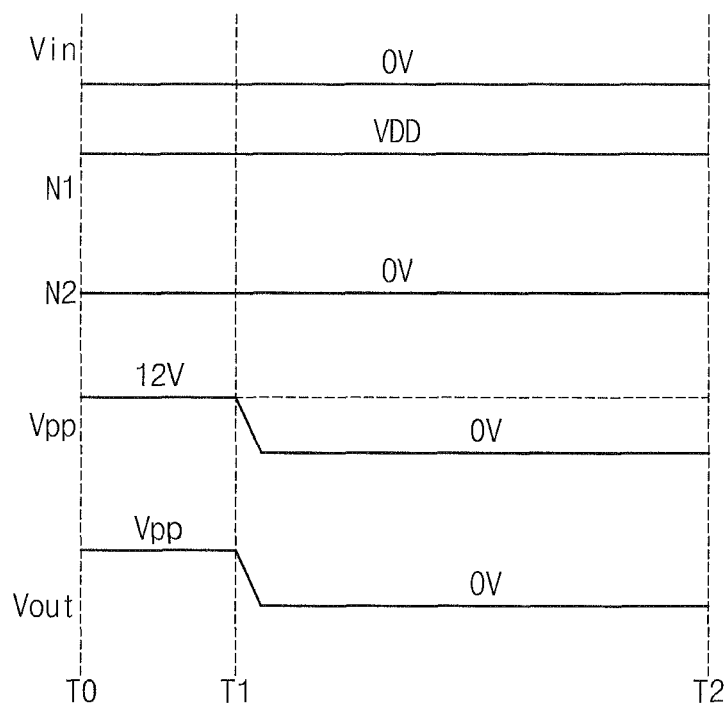
FIG. 5 is a timing diagram illustrating an operation of a high voltage switch of FIG. 3, according to an exemplary embodiment of the inventive concept.

FIG. 5 is a timing diagram illustrating an operation of a high voltage switch of FIG. 3, according to an exemplary embodiment of the inventive concept. With a high voltage switch 124 according to an exemplary embodiment of the inventive concept, although a level of a second driving voltage Vpp is varied, a level of a first driving voltage VDD may not be affected.

At T0, there is provided an input signal Vin having a ground level (e.g., 0V). At this time, the first driving voltage VDD may be transferred to a first node N1 which is an output terminal of a first inverter INV1, and a second node N2 which is an output terminal of a second inverter INV2 may be set to a ground level. It is assumed that the second driving voltage Vpp is about 12V. In this case, an output signal Vout of the high voltage switch 124 may have the second driving voltage Vpp, in other words, 12V.

It is assumed that the second driving voltage Vpp provided from an external device is dropped to about 0V at T1. In this case, a level of the output signal Vout may be affected by a variation in a level of the second driving voltage Vpp. For example, a level of the output signal Vout may be dropped to 0V from 12V by the second driving voltage Vpp.

Although the second driving voltage Vpp is dropped, output voltages of inverters INV1 and INV2, in other words, voltages of the first and second nodes N1 and N2 may be constantly maintained. This is because a current path is not formed between the first driving voltage VDD and the second driving voltage Vpp. In other words, the first driving voltage VDD is not influenced by a variation in the second driving voltage Vpp. Thus, it is possible to secure a stable operation of a nonvolatile memory device 100 as well as the high voltage switch 124.

Figure 6:
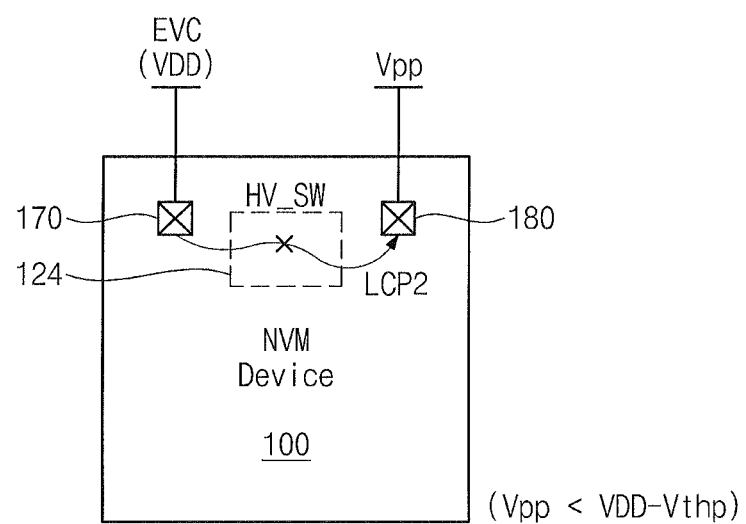
FIG. 6 is a diagram for describing an effect of an exemplary embodiment of the inventive concept.

FIG. 6 is a diagram for describing an effect of an exemplary embodiment of the inventive concept. Referring to FIG. 6, a nonvolatile memory device 100 according to an exemplary embodiment of the inventive concept may include a high voltage switch 124 of FIG. 3. In addition, the nonvolatile memory device 100 may further include a pad 170 supplied with a first driving voltage VDD and a pad 180 supplied with a second driving voltage Vpp.

The first driving voltage VDD may be supplied from an external device (e.g., electronic voltage controller EVC) to the nonvolatile memory device 100 through the pad 170. The second driving voltage Vpp may be supplied from the external device to the nonvolatile memory device 100 through the pad 180. The high voltage switch 124 may be supplied with the first driving voltage VDD to be used as a pull-up voltage of inverters INV1 and INV2 from the pad 170. The high voltage switch 124 may be supplied with the second driving voltage Vpp for converting a low voltage of an input signal into a high voltage from the pad 180.

In some cases, a level of the second driving voltage Vpp may be lower than a reference voltage (e.g., VDD-Vthp). Here, 'Vthp' may represent a threshold voltage of a PMOS transistor PM1. Since a current path is not formed between a power supply voltage (e.g., VDD) (or, pull-up terminals) of the inverters INV1 and INV2 and the second driving voltage Vpp, a leakage current path is not formed between the first driving voltage VDD and the second driving voltage Vpp.

Figure 7:
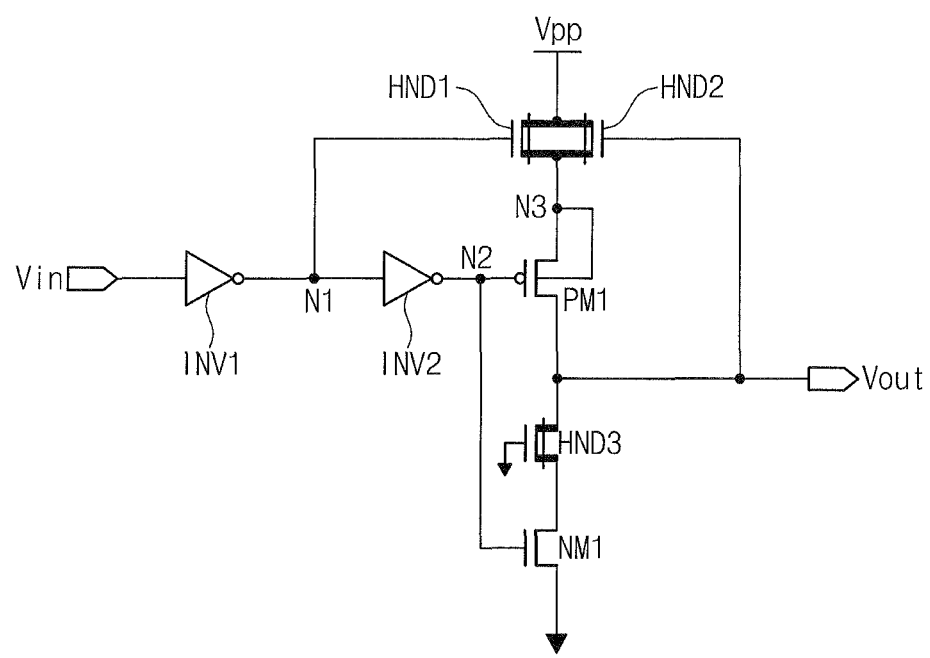
FIG. 7 is a circuit diagram illustrating a high voltage switch according to an exemplary embodiment of the inventive concept.

FIG. 7 is a circuit diagram illustrating a high voltage switch according to an exemplary embodiment of the inventive concept. Referring to FIG. 7, a high voltage switch 124a may include first and second inverters INV1 and INV2 supplied with an input signal Vin, first to third depletion type transistors HND1 to HND3, a PMOS transistor PM1, and an NMOS transistor NM1. Here, the third depletion type transistor HND3 may be used as a protection transistor for protecting the NMOS transistor NM1 from a high voltage.

The input signal Vin may be provided to the first inverter INV1. An output signal of the first inverter INV1 may be provided to the second inverter INV2. An output terminal of the first inverter INV1 may correspond to a first node N1. An output signal of the first inverter INV1 may be applied to a gate of the first depletion type transistor HND1. Here, a first driving voltage VDD provided from an external device may be used as a power supply voltage of the first and second inverters INV1 and INV2. Thus, output signals of the first and second inverters INV1 and INV2 may swing to have a ground voltage (e.g., 0V) or the first driving voltage VDD.

An output terminal of the second inverter INV2 may correspond to a second node N2. The second node N2 may be connected to gates of the PMOS and NMOS transistors PM1 and NM1. A connection node of the PMOS transistor PM1 and the third depletion type transistor HND3 may form an output terminal Vout of the high voltage switch 124a. The transistors PM1, HND3, and NM1 may operate as an inverter.

The first and second depletion type transistors HND1 and HND2 may constitute a unit for providing a source of the PMOS transistor PM1 with a second driving voltage Vpp which is a high voltage provided from an external device in time. This may be substantially the same as described with reference to FIG. 3.

In the high voltage switch 124a according to an exemplary embodiment of the inventive concept, a current path may not exist between the first driving voltage VDD which is a power supply voltage of the inverters INV1 and INV2 and the second driving voltage Vpp which is a power supply voltage of the depletion type transistors HND1 and HND2. In the case that the second driving voltage Vpp is sharply lowered, a leakage current path due to a voltage difference may not be formed between the first driving voltage VDD and the second driving voltage Vpp.

In FIG. 7, the protection transistor HND3 may be provided to protect the NMOS transistor NM1 from a high voltage applied to the output terminal Vout. In the event that the second driving voltage Vpp is applied to the output terminal Vout, a drain-source voltage of the NMOS transistor NM1 turned on may nearly reach the second driving voltage Vpp. At this time, the NMOS transistor NM1 may be broken down by the second driving voltage Vpp. In the event that the protection transistor HND3 is inserted, a drain-source voltage of the NMOS transistor NM1 may be maintained at a threshold voltage of the protection transistor HND3. Thus, it is possible to prevent the NMOS transistor NM1 from being broken down.

Figure 8:
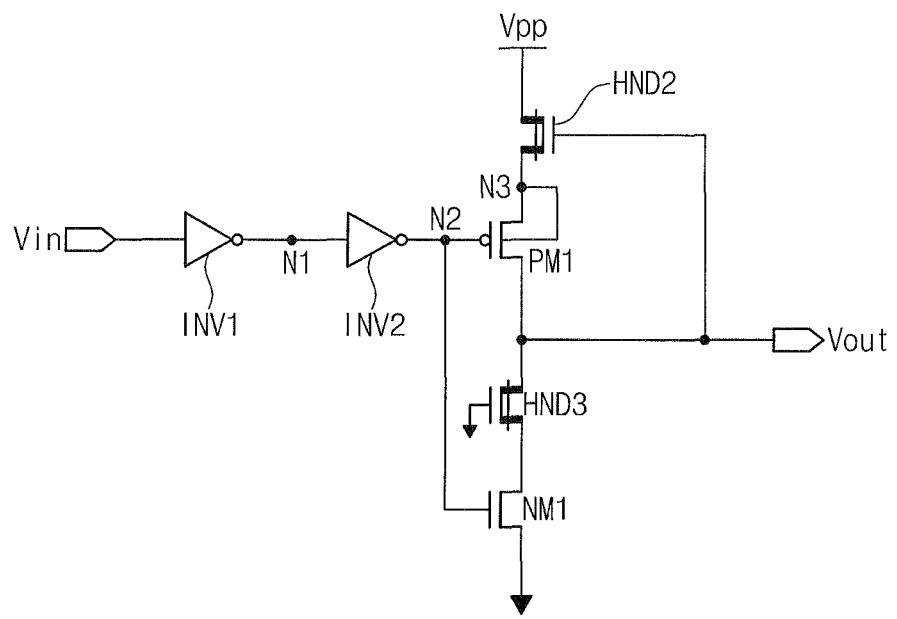
FIG. 8 is a circuit diagram illustrating a high voltage switch according to an exemplary embodiment of the inventive concept.

FIG. 8 is a circuit diagram illustrating a high voltage switch according to an exemplary embodiment of the inventive concept. Referring to FIG. 8, a high voltage switch 124b may include first and second inverters INV1 and INV2 supplied with an input signal Vin, depletion type transistors HND2 and HND3, a PMOS transistor PM1, and an NMOS transistor NM1. Here, the depletion type transistor HND3 may be used as a protection transistor for protecting the NMOS transistor NM1 from a high voltage.

The input signal Vin may be provided to the first inverter INV1. An output signal of the first inverter INV1 may be provided to the second inverter INV2. An output terminal of the first inverter INV1 may correspond to a first node N1. A first driving voltage VDD provided from an external device may be used as a power supply voltage of the first and second inverters INV1 and INV2. Thus, output signals of the first and second inverters INV1 and INV2 may have a ground voltage (e.g., 0V) or the first driving voltage VDD.

An output terminal of the second inverter INV2 may correspond to a second node N2. The second node N2 may be connected to gates of the PMOS and NMOS transistors PM1 and NM1. A connection of the PMOS transistor PM1 and the depletion type transistor HND3 may form an output terminal Vout of the high voltage switch 124b. A voltage of an output terminal Vout may be fed back to a gate of the depletion type transistor HND2. Here, a depletion type transistor HND1 (refer to FIG. 3) for improving speed may not be provided.

As a protection transistor, the depletion transistor HND3 may be provided to protect the NMOS transistor NM1 from a high voltage applied to the output terminal Vout. Although a second driving voltage Vpp is applied to the output terminal Vout, the NMOS transistor NM1 may be protected by the depletion transistor HND3.

Figure 9:
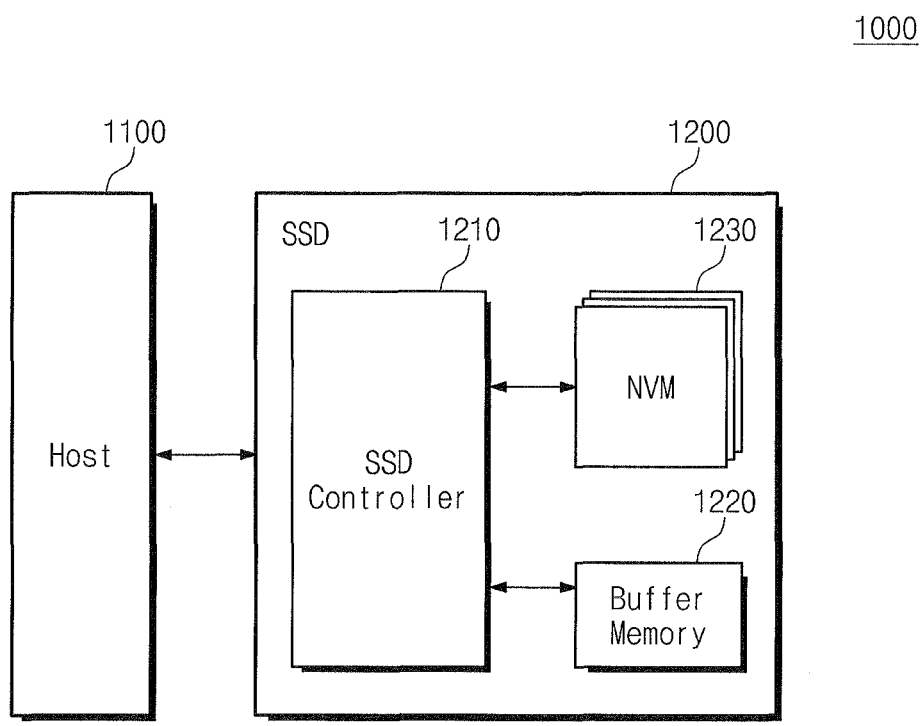
FIG. 9 is a block diagram illustrating a user device including a solid state drive according to an exemplary embodiment of the inventive concept.

FIG. 9 is a block diagram illustrating a user device including a solid state drive according to an exemplary embodiment of the inventive concept. Referring to FIG. 9, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide a physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100 to access the nonvolatile memory device 1230 based on the decoding result. The bus format of the host 1100 may include Universal Serial Bus (USB), Small Computer System Interface (SCSI), Peripheral Component Interconnect (PCI) express, Advanced Technology Attachment (ATA), Parallel ATA (PATA), Serial ATA (SATA), Serial Attached SCSI (SAS), and the like.

The buffer memory 1220 may temporarily store write data provided from the host 1100 or data read out from the nonvolatile memory device 1230. In the event that data existing in the nonvolatile memory device 1230 is cached, at a read request of the host 1100, the buffer memory 1220 may support a cache function to provide cached data directly to the host 1100. A data transfer speed of a bus format (e.g., SATA or SAS) of the host 1100 may be higher than that of a memory channel of the SSD 1200. In other words, in the event that an interface speed of the host 1100 is fast, lowered performance due to a speed difference may be minimized by providing the buffer memory 1220 having a large storage capacity.

The nonvolatile memory device 1230 may be used as a storage medium of the SSD 1200. The nonvolatile memory device 1230 may be formed of a NAND flash memory with a mass storage capacity. The nonvolatile memory device 1230 may be formed of a plurality of memory devices. In this case, the memory devices of the nonvolatile memory device 1230 may be connected with the SSD controller 1210 by the channel unit.

The nonvolatile memory device 1230 may include a high voltage switch according to an exemplary embodiment of the inventive concept. Thus, the nonvolatile memory device 1230 may control a high voltage without the need for a circuit to detect a variation in a high voltage provided from an external device.

There has just been described an example in which as a storage medium, the nonvolatile memory device 1230 is formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, an exemplary embodiment of the inventive concept may be applied to a memory system which uses different types of memory devices. The nonvolatile memory device 1230 may include a buffer area for a buffer program operation and a main area for a main program operation.

Figure 10:
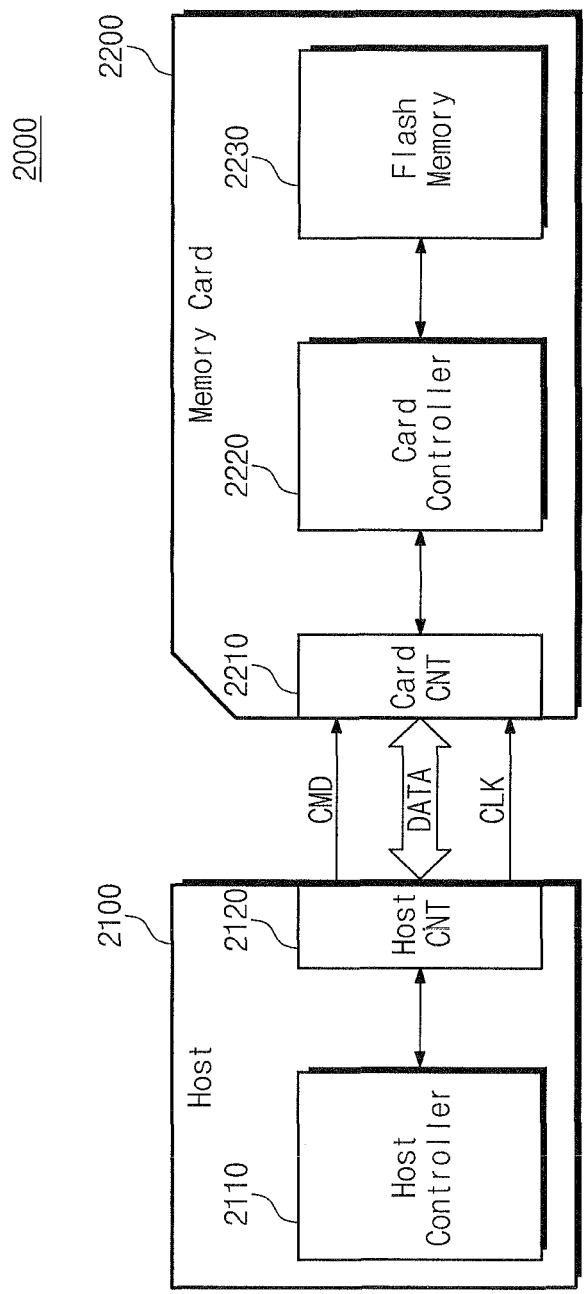
FIG. 10 is a block diagram illustrating a memory card system according to an exemplary embodiment of the inventive concept.

FIG. 10 is a block diagram illustrating a memory card system according to an exemplary embodiment of the inventive concept. Referring to FIG. 10, a memory card system 2000 may include a host 2100 and a memory card 2200. The host 2100 may include a host controller 2110 and a host connection unit 2120. The memory card 2200 may include a card connection unit 2210, a card controller 2220, and a flash memory 2230.

Each of the host connection unit 2120 and the card connection unit 2210 may be formed of a plurality of pins. Such pins may include a command pin, a data pin, a clock pin, a power pin, etc. The number of pins may vary according to a type of the memory card 2200. In an exemplary embodiment of the inventive concept, a secure digital (SD) card that includes nine pins may be used. However, the number of pins is not limited to nine.

The host 2100 may be configured to write data in the memory card 2200 or to read data stored in the memory card 2200. The host controller 2110 may send a command CMD (e.g., a write command), a clock signal CLK generated within a clock generator (not shown) of the host 2100, and data to the memory card 2200 via the host connection unit 2120.

The card controller 2220 may operate responsive to a write command received via the card connection unit 2210, and may store data in the flash memory 2230 in synchronization with a clock signal generated by a clock generator (not shown) of the card controller 2220. The flash memory 2230 may store data transferred from the host 2100. For example, if the host 2100 is a digital camera, the flash memory 2230 may store image data.

The flash memory 2230 according to an exemplary embodiment of the inventive concept may include memory cells stacked in a direction perpendicular to a substrate. The flash memory 2230 may include a high voltage switch according to an exemplary embodiment of the inventive concept. Thus, the flash memory 2230 may control a high voltage without including a circuit for detecting a variation in a high voltage provided from an external device.

The card connection unit 2210 may be configured to communicate with an external device (e.g., the host 2100) using one of various interface protocols such as USB, Multi Media Card (MMC), PCI-E, SAS, SATA, PATA, SCSI, Enhanced Small Disk Interface (ESDI), Integrated Drive Electronics (IDE), and the like.

A nonvolatile memory device and/or a memory controller may be packed by in various types of packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-Level Processed Stack Package (WSP), and the like.

While the inventive concept has been shown and described with reference to exemplary embodiments thereof, it will be apparent to those of ordinary skill in the art that various changes in form and detail may be made thereto without departing from the spirit and scope of the inventive concept as defined by the claims.

What is claimed is:

1. A high voltage switch of a nonvolatile memory device, comprising:
   a first depletion type NMOS transistor configured to switch a second driving voltage in response to an output signal of the high voltage switch;
   at least one inverter configured to convert a voltage of an input signal of the high voltage switch into a first driving voltage or a ground voltage, wherein the second driving voltage is received from an external device; and
   a PMOS transistor configured to transfer the second driving voltage provided to a first terminal of the PMOS transistor from the first depletion type NMOS transistor to a second terminal of the PMOS transistor as the output signal in response to an output of the at least one inverter,
   wherein the output of the at least one inverter is transferred to a gate terminal of the PMOS transistor,
   wherein the at least one inverter comprises:
   a first inverter configured to invert the input signal; and
   a second inverter configured to invert an output of the first inverter,
   wherein the high voltage switch further comprises:
   a second depletion type NMOS transistor configured to transfer the second driving voltage to the first terminal of the PMOS transistor response to the output of the first inverter.

2. The high voltage switch of claim 1, Wherein an output of the second inverter is provided to the gate terminal of the PMOS transistor.

3. The high voltage switch of claim 1, further comprising:
   an NMOS transistor configured to connect the second terminal of the PMOS transistor and a ground in response to the output of the at least one inverter.

4. The high voltage switch of claim 3, further comprising:
   a third depletion type NMOS transistor configured to connect the second terminal of the PMOS transistor arid a first terminal of the NMOS transistor.

5. The high voltage switch of claim 4, wherein a gate terminal of the third depletion type NMOS transistor is grounded.

6. The high voltage switch of claim 1, wherein the first driving voltage is a pull-up voltage of the at least one inverter.

7. A nonvolatile memory device, comprising:
   a cell array including memory cells connected to a word line and a bit line;
   a pass transistor configured to transfer a first high voltage to the word line; and
   a high voltage switch configured to convert a voltage level of an input signal of the high voltage switch to a second high voltage provided from an external device to be applied to a gate of the pass transistor,
   wherein the high voltage switch comprises:
   at least one inverter configured to pull a voltage level of the input signal up to the second high voltage or down to a ground voltage;
   a PMOS transistor having a gate connected to receive an output of the at least one inverter and configured to transfer the second high voltage provided to a source of the PMOS transistor to a drain of the PMOS transistor; and
   a first depletion type NMOS transistor configured to transfer the second high voltage to the source of the PMOS transistor in response to an output signal of the high voltage switch transferred to the drain of the PMOS transistor, wherein the nonvolatile memory device further comprises:
a second depletion type NMOS transistor configured to transfer the second high voltage to the source of the PMOS transistor in response to the input signal.

8. The nonvolatile memory device of claim 7, wherein the first high voltage is obtained by boosting the second high voltage.

9. The nonvolatile memory device of claim 7, wherein the input signal is a block selection signal.

10. The nonvolatile memory device of claim 7, further comprising:
an NMOS transistor configured to connect the drain of the PMOS transistor and a ground in response to the input signal.

11. The nonvolatile memory device of claim 10, further comprising:
a third depletion type NMOS transistor connected between the NMOS transistor and the PMOS transistor.

12. The nonvolatile memory device of claim 11, wherein a gate of the third depletion type NMOS transistor is grounded.

13. A high voltage switch of a nonvolatile memory device, comprising:
an inverter unit configured to receive an input signal of the high voltage switch;
a first depletion type transistor configured to receive an output of the high voltage switch and a high voltage provided from an external device; and
a transistor configured to receive a first output of the inverter unit at a first terminal and the high voltage via the first depletion type transistor at a second terminal,
wherein a third terminal of the transistor provides the output of the high voltage switch,
wherein the high voltage switch further comprises:
a second depiction type transistor configured to transfer the high voltage to the transistor in response to a second output of the inverter unit.

14. The high voltage switch of claim 13, wherein the inverter unit includes a plurality of inverters.

15. The high voltage switch of claim 13, wherein the first depletion type transistor is a depletion type NMOS transistor.

16. The high voltage switch of claim 13, Wherein the transistor is a PMOS transistor.

* * * * *